(12) United States Patent
Ma et al.

(10) Patent No.: US 11,251,215 B2
(45) Date of Patent: *Feb. 15, 2022

(54) CMOS IMAGE SENSOR WITH PUMP GATE AND EXTREMELY HIGH CONVERSION GAIN

(71) Applicant: TRUSTEES OF DARTMOUTH COLLEGE, Hanover, NH (US)

(72) Inventors: Jiaju Ma, Monrovia, CA (US); Eric R. Fossum, Wolfeboro, NH (US)

(73) Assignee: TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/397,841

(22) Filed: Apr. 29, 2019

(65) Prior Publication Data

US 2019/0252428 A1 Aug. 15, 2019

Related U.S. Application Data

(63) Continuation of application No. 15/301,267, filed as application No. PCT/US2015/023945 on Apr. 1, 2015, now Pat. No. 10,319,776.

(Continued)

(51) Int. Cl.
*H01L 27/146* (2006.01)

(52) U.S. Cl.
CPC .... *H01L 27/1464* (2013.01); *H01L 27/14614* (2013.01); *H01L 27/14616* (2013.01);
(Continued)

(58) Field of Classification Search
CPC combination set(s) only.
See application file for complete search history.

(56) References Cited

U.S. PATENT DOCUMENTS

| 5,491,354 A | 2/1996 | Hynecek et al. |
| 2011/0080509 A1 | 4/2011 | Katsuno |

(Continued)

FOREIGN PATENT DOCUMENTS

WO    WO 2015/006008 A1    1/2015

OTHER PUBLICATIONS

Masoodian, S. et al., "Early Research Progress on Quanta Image Sensors", International Image Sensor Workshop Jun. 12, 2013, [retrieved on Jun. 20, 2015]. Retrieved from the Internet URL:http://citeseerx.ist.psu.edu/viewdoc/download?doi=10.1.1.308.451&rep=rep1&type=pdf; entire document.

(Continued)

*Primary Examiner* — Ratisha Mehta
(74) *Attorney, Agent, or Firm* — David V. Rossi; Haug Partners LLP

(57) ABSTRACT

Some embodiments relate to an image sensor pixel comprising a transfer gate formed on a first surface of a semiconductor substrate, a floating diffusion formed in the first surface of the semiconductor substrate, and a buried-well vertically pinned photodiode having a charge accumulation/storage region disposed substantially beneath the transfer gate. The transfer gate is spaced away from the floating diffusion such that an intervening semiconductor region provides a potential barrier to charge flow from beneath the transfer gate to the floating diffusion. The transfer gate is operable to control a vertical pump gate to selectively transfer charge from the charge accumulation/storage region to the floating diffusion by pumping charge from the buried charge accumulation/storage region underlying the transfer gate, over the potential barrier, and out to the floating diffusion, such that full charge transfer can be achieved without overlapping the edge of the transfer gate with the floating diffusion.

14 Claims, 12 Drawing Sheets

Related U.S. Application Data

(60) Provisional application No. 61/973,825, filed on Apr. 1, 2014.

(52) U.S. Cl.
CPC .. *H01L 27/14621* (2013.01); *H01L 27/14627* (2013.01); *H01L 27/14643* (2013.01)

(56) References Cited

U.S. PATENT DOCUMENTS

| | | |
|---|---|---|
| 2012/0281126 A1 | 11/2012 | Fossum |
| 2013/0009224 A1 | 1/2013 | Ohri |
| 2013/0026345 A1 | 1/2013 | Hynecek et al. |
| 2013/0092982 A1* | 4/2013 | Chen ................ H01L 27/14689 257/223 |
| 2014/0063304 A1 | 3/2014 | Manabe |

OTHER PUBLICATIONS

Ma, J. et al., "A Pump-Gate Jot Device With High Conversion Gain for a Quanta Image Sensor". Journal of the Electronic Devices Society [Online], Jan. 12, 2015 [retrieved on Jun. 20, 2015]. Retrieved from the Internet: <URL:http://ericfossum.com/Publications/Papers/2015%20JEDS%20Pump%20Gate%20Jot.pdf>; entire document.

International Search Report and Written Opinion issued (dated Jul. 8, 2015) in corresponding International Application No. PCT/US2015/023945.

* cited by examiner

CMOS IMAGE SENSOR WITH PUMP GATE AND EXTREMELY HIGH CONVERSION GAIN

RELATED APPLICATIONS

This application is a continuation of application Ser. No. 15/301,267, which is a national stage application under 35 U.S.C. § 371 of International Application No. PCT/US2015/023945, filed Apr. 1, 2015, which claims the benefit of U.S. Provisional Patent Application No. 61/973,825, filed Apr. 1, 2014, each of which is hereby incorporated herein by reference in its entirety.

BACKGROUND

The present disclosure relates generally to image sensors and, more particularly, some embodiments of the present invention relate to a high conversion gain pixel architecture that is well-suited for implementing subdiffraction-limit (SDL) pixels, single-bit photoelectron counting pixels that may be used in a Quanta Image Sensor (QIS), and multi-bit photoelectron counting pixels that may be used in a quantized Digital Integration Sensor (qDIS).

In a conventional CMOS active pixel sensor with intra-pixel charge transfer, the photodetecting element is typically a pinned photodiode (PPD), and the signal charge integrated in the PPD is completely transferred to a floating diffusion (FD) node by pulsing a transfer gate (TG). The FD potential must be reset (typically by a reset transistor, just prior to transfer) to a voltage (reset voltage) that is sufficiently high such that when TG is turned on, signal charge passively and completely flows from the PPD, under the TG, and into the FD. At lower FD reset voltages, the signal charge may not transfer completely because the FD becomes "filled" with signal charge before all of the signal charge is transferred. Thus, careful circuit design is required to ensure sufficiently high voltage reset of the FD, sometimes requiring the use of overvoltages or bootstrapping. Increasing the full well of the sensor exacerbates these problems, as both the depth of the PPD well is increased, and the capacity of FD must also be increased by increasing the FD capacitance and/or reset voltage.

In the case of novel image sensor concepts such as the Digital Integration Sensor (DIS), quantized Digital Integration Sensor (qDIS), or the quanta image sensor (QIS) where full well capacity is intentionally reduced, some of the complexity of pixel design is transferred to high speed readout design. While the lower full-well requirement may provide some additional flexibility in considering ways of further shrinking the pixel to achieve higher density, providing pixels for such novel image sensors nonetheless presents many unique and new challenges as well as opportunities for technical developments to provide for high quality and performance; in other words, many technical issues and problems arise that are simply not present, or not an issue, in current state-of-the art image sensors.

For example, image sensors such as QIS, qDIS, and DIS require pixels that are highly sensitive to photoelectrons. In some implementations (e.g., QIS), photoconversion of only one or several photons must generate a voltage change that is large enough to be detected, meaning that the charge-to-voltage conversion gain may need to be more than 0.5 mV/e−, possibly as much as or more than 1 mV/e−.

SUMMARY OF SOME EMBODIMENTS

Some embodiments of the present invention provide an image sensor pixel that is compact and has low full-well capacity and high conversion gain, thus being well-suited for applications such as DIS, qDIS, and QIS image sensors.

Some embodiments provide an image sensor pixel architecture, or an image sensor having a pixel architecture, that comprises a transfer gate formed on a first surface of a semiconductor substrate, a floating diffusion region formed in the first surface of the semiconductor substrate, and a buried-well vertically pinned photodiode having a charge accumulation/storage region disposed substantially or entirely beneath the transfer gate, wherein the transfer gate does not overlap and is spaced away from the floating diffusion region such that an intervening semiconductor region provides a potential barrier to charge flow from beneath the transfer gate to the floating diffusion, and wherein the transfer gate is operable to control a vertical pump gate to selectively transfer charge from the charge accumulation/storage region to the floating diffusion by pumping charge from the buried charge accumulation/storage region underlying the transfer gate, over the potential barrier that is between the transfer gate and the floating diffusion region, and out to the floating diffusion region, such that full charge transfer can be achieved without overlapping the edge of the transfer gate TX with the FD region.

In some embodiments, the vertical pump gate may comprise a first semiconductor region disposed beneath the transfer gate and overlying the charge accumulation storage region, and a second semiconductor region disposed beneath the transfer gate and overlying the first semiconductor region and being laterally adjacent to the intervening semiconductor region, wherein the first semiconductor region provides a potential barrier that prevents charge from flowing back toward the charge accumulation/storage region during charge transfer from the second semiconductor region to the floating diffusion via the intervening semiconductor region. The first and second semiconductor regions, and the intervening semiconductor region may all have the same doping type, with the first semiconductor region having a higher dopant concentration that the second semiconductor region, and the second semiconductor region having a higher dopant concentration than the intervening semiconductor region.

Accordingly, some embodiments provide an image sensor pixel architecture that uses a vertical pump gate to control charge transfer from the charge accumulation/storage area of a buried-well vertical pinned photodiode to a floating diffusion, such that the floating diffusion can be separated from the edge of gate dielectric of the transfer gate of the vertical pump gate, thereby reducing the floating diffusion capacitance by reducing or eliminating the overlap capacitance between floating diffusion and transfer gate, thus realizing extremely high output conversion gain.

While pixels according to some embodiments of the present invention are well-suited for use in image sensors demanding very high conversion gain (e.g., QIS, qDIS, or other single-bit or multi-bit photoelectron counting sensors), it will be understood in view of the ensuing disclosure that some embodiments of the present invention are also applicable to conventional CMOS image sensors (e.g., present-day, commercially available CMOS image sensors for consumer, manufacturing, and/or scientific applications). For example, some embodiments of the present invention may be useful for conventional image sensors at least insofar as such embodiments reduce the required reset voltage level of the FD.

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Also, as used herein, "n and "p" designations (e.g., as in "n-type," "p-type," "n-well," etc.) are used in ordinary and customary manner to designate donor and acceptor type impurities that promote electron and hole carriers, respectively, as majority carriers. The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrates" in the following description, previous process steps may have been utilized to form regions or junctions in the base semiconductor structure or foundation. In addition, the semiconductor need not be silicon-based, but may be based on, for example, silicon-germanium, germanium, or gallium arsenide.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME EMBODIMENTS

Figure 1:
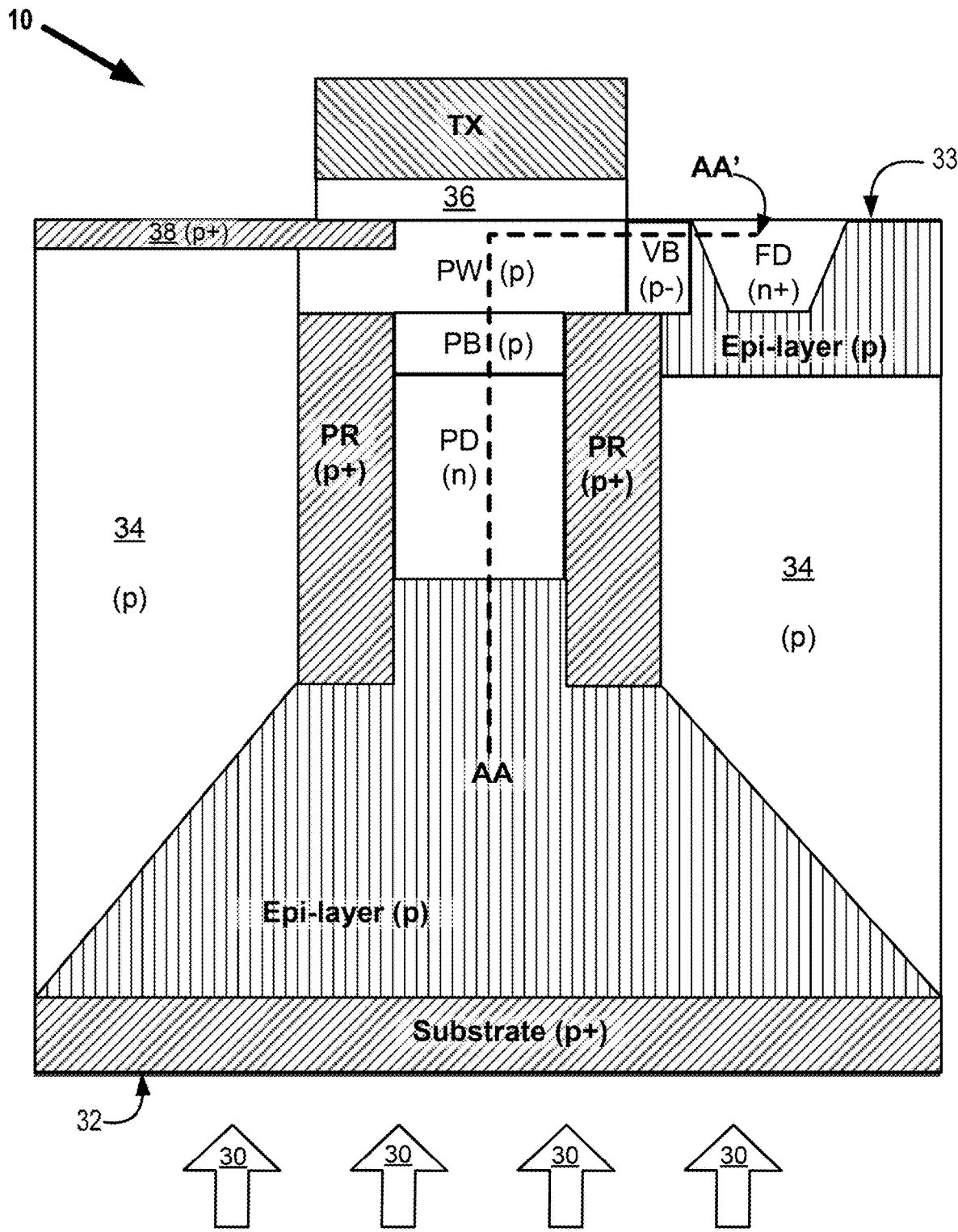
FIG. 1 schematically depicts an illustrative cross-sectional view of a portion of a pixel of a CMOS image sensor, in accordance with some embodiments of the present invention.

Briefly, as will be understood from the ensuing disclosure, some embodiments of the present invention provide an image sensor pixel that is compact and has low full-well capacity and high conversion gain. For example, compared to a conventional pinned photodiode CMOS imager pixel architecture, in which the pinning dopant layer is disposed at the upper surface of the substrate adjacent to the transfer gate, a pixel according to some embodiments of the present invention employs a buried photodiode well disposed underneath the transfer gate, with surrounding heavily doped pinning well region(s), and the device is preferably configured for backside illumination. This configuration contributes to the whole pixel device being more compact.

In addition, in a conventional CMOS image sensor with intra-pixel charge transfer, the edge of the transfer gate overlaps the floating diffusion, and the transfer gate acts like a pass transistor, selectively allowing charge stored in the photodiode well to flow directly to the floating diffusion. In contrast, a pixel according to some embodiments of the present invention provides intra-pixel charge transfer from the photodiode storage well to the floating diffusion using a vertical pump gate so that the floating diffusion can be separated from the edge of gate dielectric (e.g., oxide), minimizing, eliminating or otherwise reducing overlap capacitance between floating diffusion and transfer gate, and thereby providing for increased (e.g., extremely high) output conversion gain. (It is noted that for ease of reference, in embodiments of the present invention as set forth here, the term "transfer gate" is used to refer to the gate of the vertical pump gate).

For example, the present inventors recognized that the overlap capacitance between the transfer gate and the floating diffusion can be a significant portion of the capacitance seen by the floating diffusion in pixels with intra-charge transfer to the floating diffusion for charge-to-voltage conversion, and particularly that this portion may increase as the pixel is scaled to smaller technology nodes. Particularly, the capacitance of the FD node in a 4T-type pixel includes the overlap capacitance between the FD node and the transfer gate, the diffusion capacitance of the FD (also referred to as the junction capacitance), the effective gate capacitance of the source-follower, and the coupling capacitance from the reset transistor. And the overlap capacitance can be, for example, about one-third to about one-half of the total FD capacitance, particularly when the process scales down. As such, a 1.5× to 2× increase in conversion gain can be expected by effectively eliminating the overlap capacitance between the FD node and the transfer gate.

Accordingly, some embodiments of the present invention, discussed below, provide a novel image sensor pixel (and image sensor using such pixels) having very high conversion gain by spatially separating the floating diffusion from the edge of the gate dielectric (e.g., oxide) so as to eliminate or otherwise reduce the overlap capacitance between the FD node and the transfer gate, while using a vertical pump gate mechanism to assist charge transfer from the charge storage region of a buried-well vertical pinned photodiode.

As will be understood by those skilled in the art in view of the present disclosure, while some embodiments of the present invention are well-suited for implementing novel image sensor concepts such as DIS and QIS, various embodiments also have myriad applications in more conventional high sensitivity (e.g., low light) image sensors.

FIG. 1 schematically depicts an illustrative cross-sectional view of a portion 10 of a pixel of a CMOS image sensor, in accordance with some embodiments of the present invention. More specifically, for clarity of exposition, FIG. 1 does not show the entire architecture of a whole pixel, but focuses primarily on the charge collection and transfer portions of the illustrative pixel embodiment. As further described below, a pixel may include additional circuitry, such as transistors and interconnect structures, and an image sensor may comprise an array of such pixels (e.g., pixels arranged in rows and columns).

As shown in FIG. 1, the illustrative pixel may be fabricated on a substrate such as a p+ substrate having a p-type epitaxial layer that has a top surface 33 opposite a backside surface 32, and the pixel may be configured for backside illumination by incident light 30. In this embodiment, the pixel comprises a buried photocharge accumulation region (implemented as n-well region PD, which forms a photodiode with p+ pinning region(s) PR) disposed beneath a charge transfer gate stack (comprising transfer gate TX and gate dielectric 36) that is (i) formed on top surface 33, (ii) laterally spaced away, by an intervening p-type region (implemented as lightly doped voltage barrier region VB), from a charge collection region implemented as an n+ floating diffusion FD formed in top surface 33, and (iii) operable to control a pump gate to selectively transfer charge from the photocharge accumulation region (n-well region PD) to the charge collection region (floating diffusion FD). As indicated, additional image sensing circuitry such as transistors and interconnect structures (not shown) may be formed on the front side 33 of the substrate.

In the illustrative pixel, regions 34 have a p-type doping concentration that is greater than that of the lower epi-layer, and are configured relative to the lower epi-layer so as to increase the sensitivity of the pixel.

In some embodiments, a p+ layer 38 may be disposed to extend under a portion of the transfer gate TX, at the interface between the gate dielectric and the semiconductor PW regions, so as to suppress dark current generation current due to electrons captured and later emitted by interface traps.

In the depicted pixel embodiment, the photodiode n-well PD is entirely underneath the transfer gate (TX). In various embodiments, however, the lateral extent of n-well region PD may extend beyond the lateral extent of the transfer gate TX, provided that transfer gate TX is operable to fully transfer that maximum amount of charge that would be accumulated in the n-well region under normal operating conditions for which the device is designed for use. Typically, however, confining at least the n-well region to being entirely beneath the transfer gate TX is consistent with providing compact pixels (e.g., jots for QIS applications).

As will be understood by those skilled in the art in view of the present disclosure of the illustrative pixel, separating the edge of transfer gate TX from the floating diffusion eliminates the overlap capacitance between gate TX and floating diffusion FD, and effectively renders the capacitance between TX and FD negligible relative to other components of the FD capacitance, thereby reducing the FD capacitance and correspondingly increasing the conversion gain of the pixel. But this separation results in a potential barrier along the charge transfer path in region VB, which would impede and prevent complete transfer of charge from the charge accumulation region to the FD charge collection node.

Thus, in accordance with some embodiments of the present invention, the illustrative pixel is tailored to provide a pump gate design that is configured to, under control of transfer gate TX, pump charge from the buried photocharge accumulation region underlying the transfer gate, over the potential barrier that is between the transfer gate TX and the FD node, and out to the FD node, such that full charge transfer can be achieved without overlapping the edge of the transfer gate TX with the FD region. The transfer gate TX, therefore, operates not as a conventional transfer gate that selectively lowers the potential barrier between the pinned photodiode and the floating diffusion to allow charged stored in the photodiode to passively flow to the floating diffusion as in a conventional CMOS image sensor, but as a vertical pump gate control that controls a vertical potential well to acquire charge from the buried n-well storage/accumulation region and assist its transfer by pumping the charge over the potential barrier VB to the floating diffusion, as will be further understood below.

More specifically, this illustrative embodiment includes a buried photodiode comprising the n-well region PD buried vertically under the transfer gate and a heavily-doped p-type pinning region PR, which in some embodiments comprise two vertically planar regions that laterally sandwich n well region PD along one lateral direction (e.g., along the direction corresponding to the direction between TX and FD), while in some embodiments pinning region PR may laterally surround n-well region PD (e.g., two pairs of planar regions in orthogonal directions). The heavily doped p-type pinning regions PR set ("pin") the fully depleted potential of the buried photodiode; namely, the maximum potential of the n-well region PD in which photoelectrons are collected and stored.

A p-type barrier layer PB overlying the photodiode n-well region PD is doped more heavily than a p-type well region PW that overlies PD, so as to provide a potential barrier that prevents charge from flowing back toward PD during charge transfer from PW to FD. And region PW is more heavily doped than p-type virtual barrier region VB. During transferring, charge will be pumped through the virtual barrier to floating diffusion. More specifically, doping PB more heavily doped than PW, and doping PW more heavily than VB provides a double-step virtual potential barrier that is an important feature of the pump gate to prevent charge from flowing back toward PD (as noted above) while assisting pumping of charge from PW over the virtual barrier VB to the floating diffusion.

By way of non-limiting example, PB, PW, and VB may be doped, in order, at concentrations of $10^{16}$ cm$^{-3}$, $5\times10^{15}$ cm$^{-3}$, and $8\times10^{14}$ cm$^{-3}$. In addition, also by way of non-limiting example, the p-type epi layer forming a p-n junction with n+ region FD may be doped at $10^{15}$ cm$^{-3}$, and the p-type regions 34 may be doped at $10^{16}$ cm$^{-3}$. Further, as will be understood by those skilled in the art, in various embodiments, the doping concentration of one or more layers may vary throughout the layer to provide various features (e.g., doping of one or more layers may be graded to introduce a field assisting carrier flow).

FIGS. 2 and 3A-3D schematically depict a potential profile along path AA-AA' of FIG. 1, under an abrupt junction approximation, and illustrate the operation of the pixel and the vertical pump gate charge transfer mechanism. It is noted that these drawings are merely schematic to generally represent and illustrate the pump gate charge transfer mechanism. As such, depicted potential well widths and depths, sizes of potential steps/offsets between regions, etc., do not necessarily correspond directly (e.g., proportionately) to actual values of the potential, device dimensions, capacitance of the regions, etc. In addition, while for ease of representation charge is schematically represented as a continuous "fluid" rather than as discrete charge (e.g., electrons), it will be understood, as discussed, that such high conversion gain pixels may be configured for small full well capacity (e.g., <1000 e) or even for detecting a single or several photoelectrons (i.e., accumulating, one or several photoelectrons, and transferring it/them to the FD for conversion into a detectable voltage signal).

Figure 2:
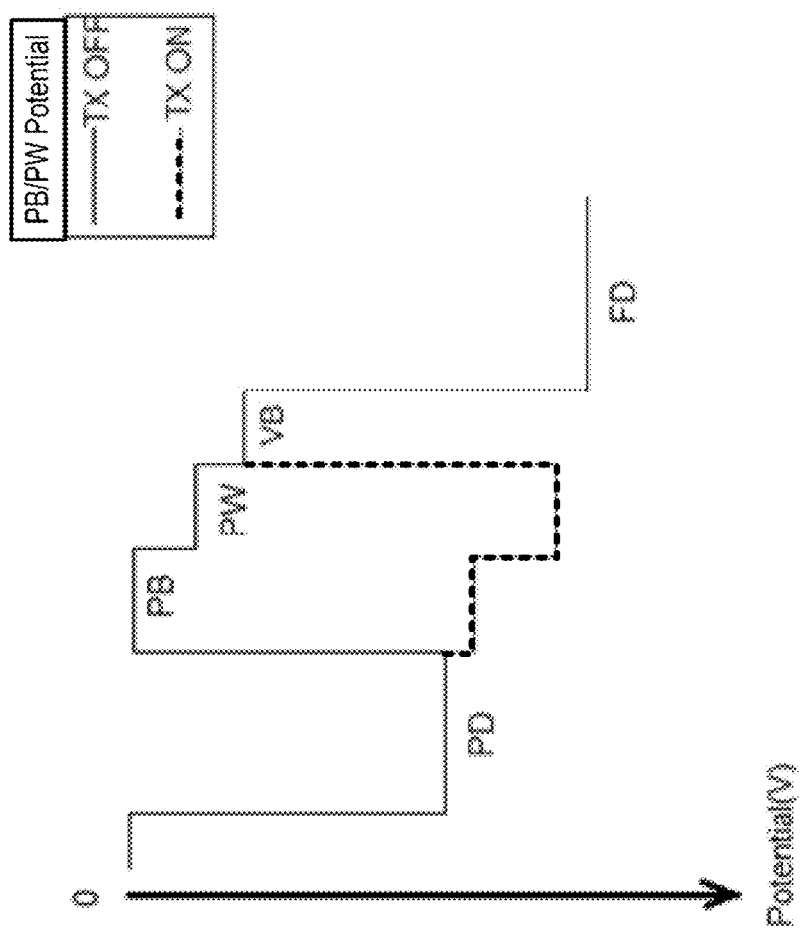
FIG. 2 schematically depict a potential profile along path AA-AA' of FIG. 1, under an abrupt junction approximation, in accordance with some embodiments.

Particularly, FIG. 2 schematically depicts the potential profile in the fully depleted condition, when TX is OFF (e.g., zero voltage, or reverse biased, e.g., due to flatband voltage) and when TX is ON (e.g., positive voltage; forward biased). Since the substrate is grounded and PB layer is heavily doped, the potential of PB is fixed and the potential of PB is 0. Since PW is lower doped than PB, and VB is lower doped than PW, the potential profile of PW and VB is a double-stepped shape, as shown.

Figure 3A:
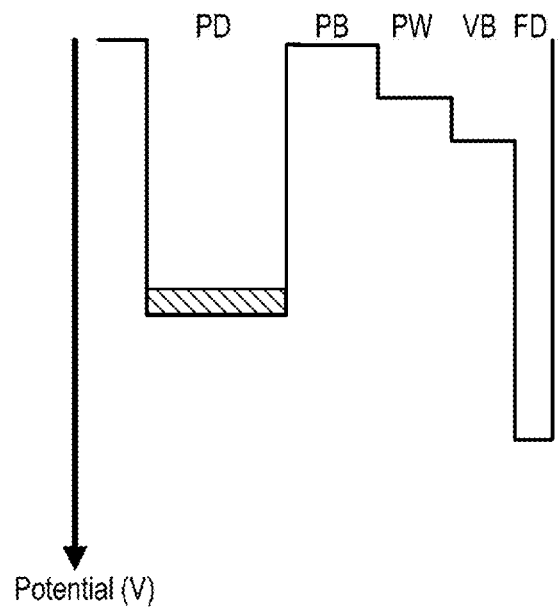
FIGS. 3A-3D schematically depict potential profiles along path AA-AA' of FIG. 1, under an abrupt junction approximation, illustrating the operation of the pixel and the vertical pump gate charge transfer mechanism, in accordance with some embodiments.

As shown in FIG. 3A, during integration of charge in PD, TX is OFF (e.g., reverse biased), and the PW region is in the depletion mode. As understood by those skilled in the art, the photoelectron collected by PD will decrease the potential of PD.

Figure 3B:
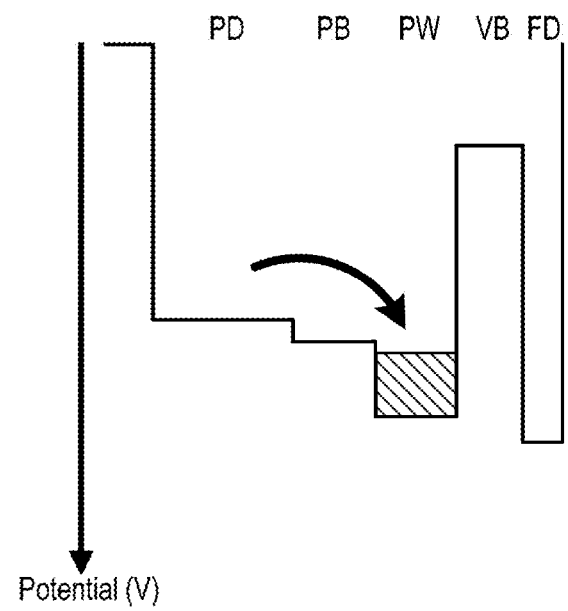

As shown in FIG. 3B, after integration, to initiate charge transfer TX is turned ON (forward biased). The potentials of PW and PB follow the applied gate voltage, and the potential PW becomes greater than the potential of region VB. In order to fully transfer out all the charge in PD, the potential of PB should be able to reach higher than the depletion potential of PD. Also, because the PW region is more lightly doped and closer to the gate than PB, the potential of PW will be always higher than PB. In addition, VB will be depleted and still form a virtual barrier between PW and FD. Accordingly, when TX in ON, the charge in PD will flow quickly to the PW region.

While the TX is being turned OFF, the potential profile will recover to the starting level. Meanwhile the potential of PB will always lower than PW, which will prevent the charge from being injected back to PD. The charge will stay in PW region until the potential of PW becomes lower than the VB. After that, the decreasing potential in PW will force the charge to flow to FD.

Figure 3C:
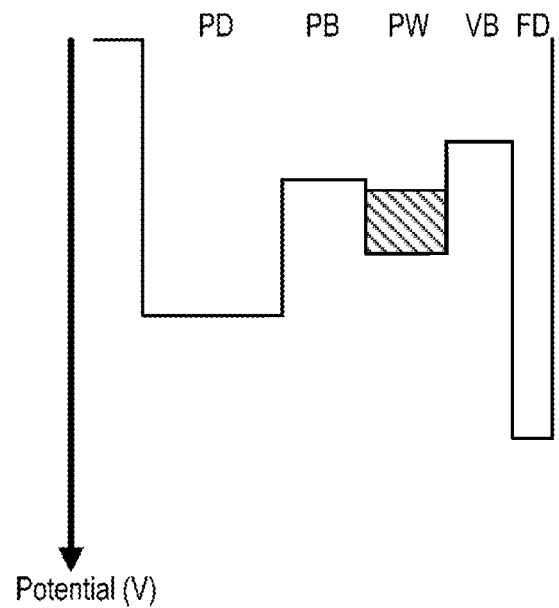

Next, as shown in FIG. 3C, when TX is turning OFF, the potential of PW and PB start to decrease, and the potential of PB will be always lower than that of PW, which will prevent the charge from being injected back to PD. The charge will stay in PW until the potential of PW becomes lower than VB.

Figure 3D:
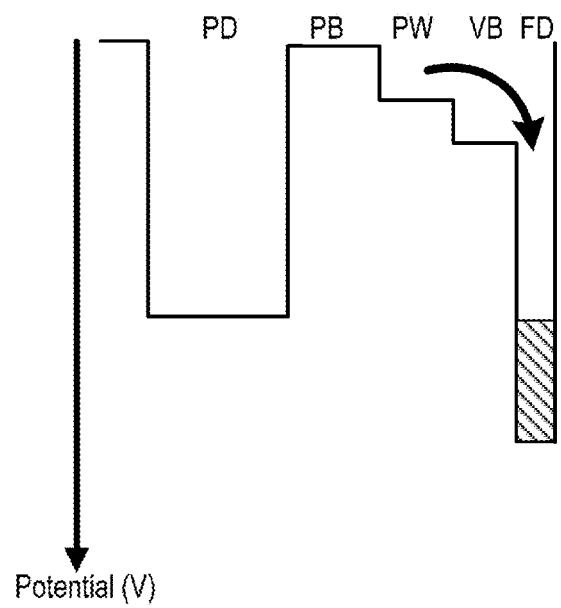

As represented by FIG. 3D, as TX continues turning OFF and the potential of PW becomes lower than VB, the decreasing potential in PW will force the charge to flow through VB to FD and complete the whole charge transfer process.

As will be understood by those skilled in the art, the potential difference between PW and PB and the capacitance of the MOS gate determines how much charge can be stored in PW when transferring, which in some embodiments should be sufficient to handle the full well capacity of PD to ensure that PD can be fully depleted by one transfer.

In some embodiments, however, the charge capacity of PW may be limited to less than the full-well capacity of PD, and multiple transfer cycles may be employed to transfer the charge accumulated in PD to the floating diffusion FD. Limiting the charge capacity of PW to less than the full-well capacity of PD may be desired in some embodiments; e.g., where the FD area is limited to further reduce the FD capacitance to provide a higher conversion gain.

Particularly, in some embodiments, the capacity of FD may be sufficient to handle the full-well capacity of the PD, whether transferred to the FD in a single transfer or in multiple transfers (without resetting the FD between such transfers). But in some embodiments, the capacity of FD may be limited (e.g. to provide higher conversion gain) such that multiple transfers may be required to readout charge accumulated in PD in one integration period and the FD may be reset between successive ones of the multiple transfers (e.g., such that individually read out signals corresponding to one integration period may be added in the digital domain, such as in a qDIS or DIS implementation).

It will be understood in view of the foregoing that some embodiments of the disclosed pixel are well-suited for shared pixels, namely, in shared pixel architectures that share at least the floating diffusion (e.g., and which, for example, may also share the source-follower, etc.). (As known to those skilled in the art, such shared architectures may be used for in-pixel charge-domain binning.) Particularly, because in such shared pixel architecture embodiments each of the transfer gates of respective pixels sharing a common floating diffusion (FD) region do not overlap the shared (common) floating diffusion (FD) region (and are implemented as vertical pump gates), the shared pixel architecture will not introduce extra overlap capacitance to the FD node. In other words, the high conversion gain of the FD will not be undermined by sharing the FD among two or more pixels.

By way of example, in some embodiments a four-way shared pixel structure/unit can be used (e.g., possibly comprising 7 transistors per shared pixel unit), which will further shrink the size of each pixel (e.g., each jot of a QIS). And in some such shared-pixel embodiments, the four jots sharing a common FD can be covered by a single color filter and micro lens, which will mitigate the effects of cross-talk between jots. Further, in some such embodiments, each shared-pixel unit comprising four jots (e.g., and having a single color filter and microlens) can be isolated by a single Deep Trench Isolation (DTI) around the set of four jots. That is, four jots sharing a FD are not isolated from each other by DTI, but rather are collectively isolated by DTI from other shared pixel units (i.e., other units of four jots sharing an FD). Such DTI will further reduce cross-talk between shared pixel units associated with respective color filters. It will be understood that other configurations of shared pixel units (e.g., different numbers of jots sharing a common FD) may be implemented accordingly.

Further, in view of the foregoing disclosure, it will be understood that in some embodiments, a pump-gate configuration may also be possibly used to avoid the overlap between the floating diffusion and the reset gate.

Alternatively, in some embodiments, in order to further decrease the FD capacitance, a diode may be used to reset the FD node instead of a reset transistor, so that the coupling capacitance from reset transistor can be eliminated. Such embodiments also facilitate suppressing the charge injection effect during the reset.

Those skilled in the art will also understand in view of the foregoing that, in some embodiments, to realize extremely high conversion gain, the p-well located under floating diffusion FD should be very lightly doped. On the other hand, this doping should be high enough to prevent the depletion region of FD from extending to PD.

Those skilled in the art will also understand in view of the foregoing that very low dark current may also be provided by pixel structures according to some embodiments. For example, in some implementations, because during integration, the higher-doped PB will block PD from the surface interface, and the dark current charge generated could only flow to FD, which will not have bad influence to the signal.

Figure 4:
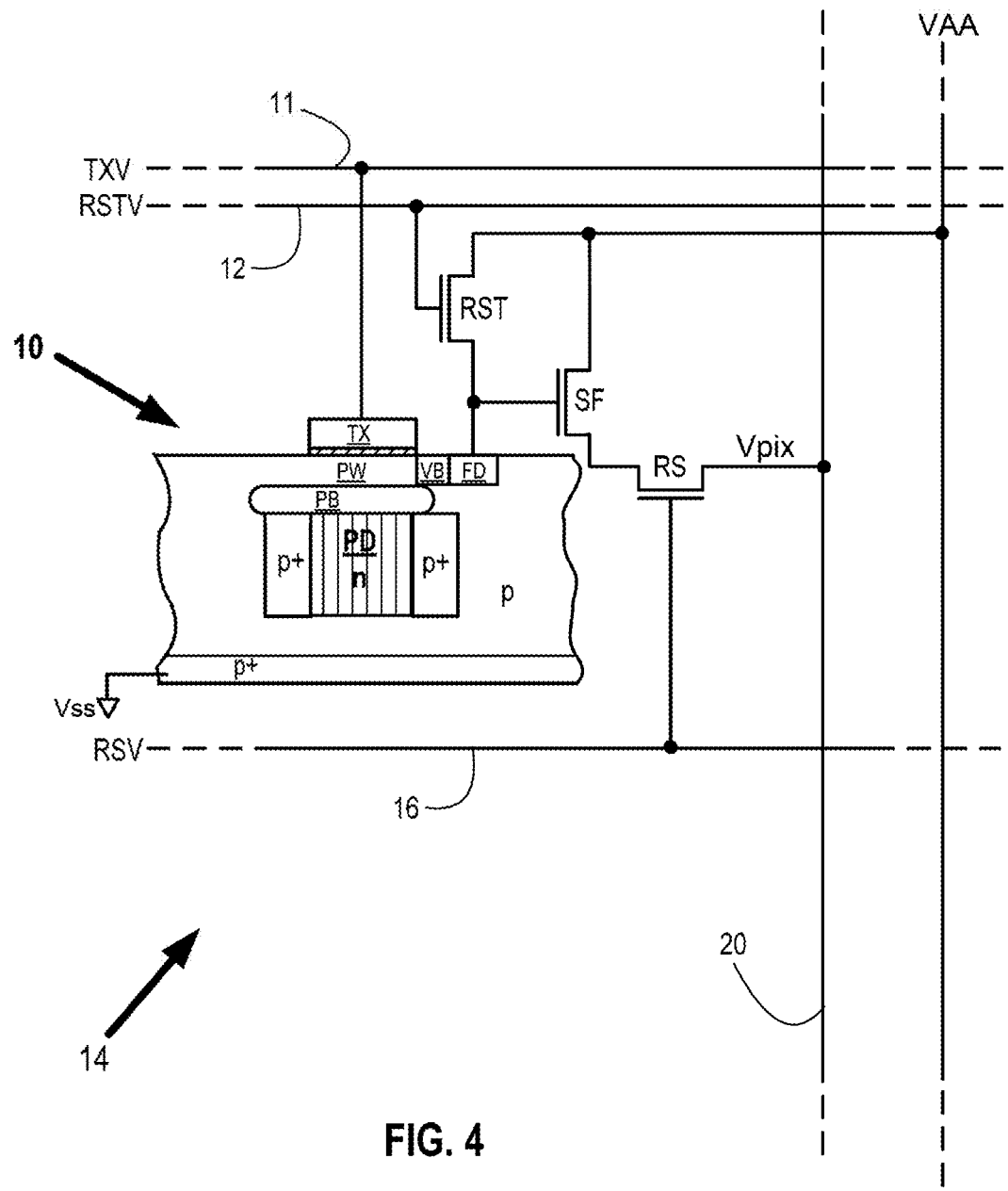
FIG. 4 schematically depicts a pixel circuit 14 comprising a portion of a pixel such as the portion depicted in FIG. 1, in accordance with some embodiments.

FIG. 4 schematically depicts a pixel circuit 14 comprising a portion 10 such as portion 10 of FIG. 1. More specifically, simply for purposes of illustration of some illustrative variations that are possible, the portion 10 of pixel 14 in FIG. 4, while similar to portion of pixel 10 in FIG. 1, has a somewhat different layer design. Nonetheless, for purposes of the ensuing description, portion 10 of FIG. 4 functions and operates to accumulate charge in a buried-well region pD (disposed beneath a transfer gate TX) and transfer that accumulated charge to a high conversion gain floating diffusion region FD according to a vertical pump-gate mechanism under control of transfer gate TX in accordance with the function and operation of the vertical pump-gate buried-well pixel described with reference to the foregoing figures.

In operation, a row select transistor RS is activated by row select signal RSV on line 16 and connects the imager pixel 14 to a column line 20. A reset transistor RST is typically turned on by a reset signal RSTV on line 12 and the floating diffusion region FD is reset to a predetermined voltage (e.g., $V_{AA}$). Integration of backside incident photons and accumulation in PD of photo-electrons generated from the photons is conducted at least during the reset period and prior to the application of a transfer gate voltage signal TX. The transfer gate voltage signal TXV applied on line 11 to transfer gate TX is then clocked ON and OFF (as described above) to cause the accumulated charge in the photodiode buried-well PD to transfer to the collection or floating diffusion region FD.

As illustrated, the collection or floating diffusion region FD is electrically connected to the gate of a source follower transistor SF, the output of which is selectively applied to the column line 20 by row select transistor RS as pixel voltage Vpix. The reset transistor RST selectively resets the collection or floating diffusion region FD to a predetermined voltage by coupling a voltage $V_{AA}$ to the collection or floating diffusion region FD during a reset period which precedes or follows a charge accumulation or integration period.

Figure 5:
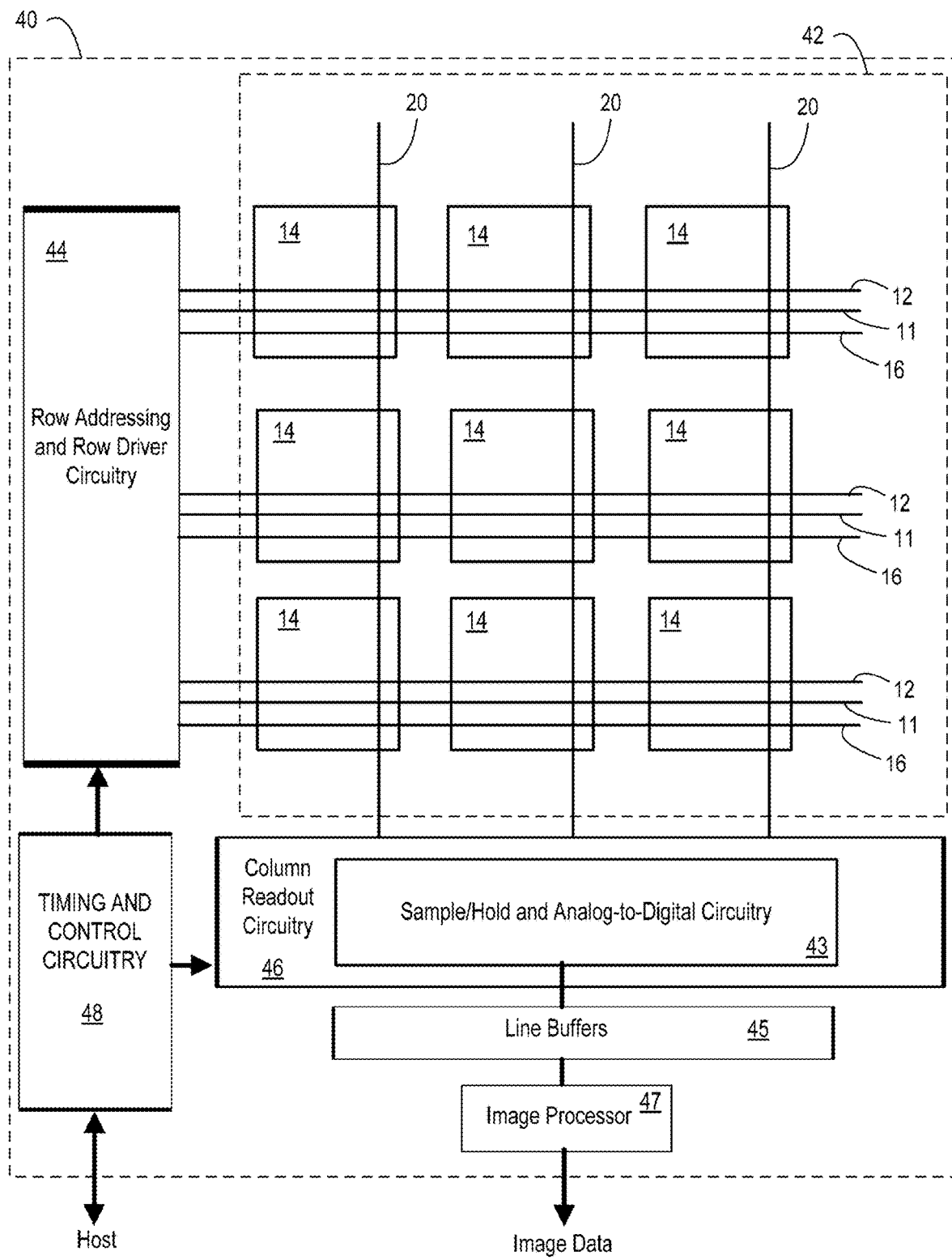
FIG. 5 depicts a block diagram of an illustrative CMOS image sensor architecture that may be used to implement embodiments in accordance with the present disclosure, in accordance with some embodiments.

FIG. 5 depicts a block diagram of an illustrative CMOS image sensor 40 architecture that may be used to implement embodiments in accordance with the present disclosure, such as embodiments of backside-illuminated high conversion gain vertically-pinned buried-well pixels in accordance with those described hereinabove in connection with FIGS. 1 and 4. As well known, pixel array 42 typically includes a large number of pixels arranged in an M×N array; however, CMOS image sensor 40 is shown as including a simplified pixel array 42 comprising a three by three array of pixels 14, which, for ease of discussion, is a 4T pixel circuit in this embodiment (e.g., as per FIG. 4), but may be any of a variety of pixel circuit types (e.g., a reset diode may be implemented instead of a reset transistor). And, in some embodiments, the pixels may be shared pixels and may further be configured for in-pixel binning.

Row Addressing and Row Driver Circuitry 44 generates transfer gate control signals on lines 11, row select signals on lines 16, an reset gate control signals on lines 12. Column Readout Circuitry 46 includes analog-to-digital circuitry 43 for sampling and digitizing output values readout from the pixel array 42. Particularly, circuitry 43 may be implemented to comprise a plurality of A/D converters configured to implement column-parallel readout. In some embodiments, the circuitry 43 may be configured such that the readout circuitry associated with each column bus 20 may have a respective analog-to-digital converter (ADC), though in some embodiments pairs of columns may share an ADC.

Timing and control circuitry 48 controls both the row addressing and row driver circuitry 44 and the column readout circuitry 43. For instance, timing and control circuitry controls the row addressing and row driver circuitry 44 for selecting the appropriate row for readout, and may, for example, provide timing control signals in accordance with rolling shutter readout or global shutter readout. As indicated in FIG. 5, timing and control circuitry 48 may also communicably interface with a host (e.g., a processor associated with a system comprising the image sensor), which may, for example, in some implementations, specify various control information.

As schematically depicted, signals on column buses 20 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody high conversion gain buried-well vertically-pinned pixels in accordance with some embodiments of the present disclosure. By way of example, it will be understood that circuitry 46 may be divided into two portions provided at the top and bottom of the pixels array.

Illustrative Example

The following example is provided to illustrate some embodiments of the present invention as well as various features and advantages that may be associated with some embodiments, and is not intended to limit the present invention.

A three-dimensional Synopsis TCAD simulation was performed for a 0.9 micron pitch model of an illustrative embodiment of a portion of the device comprising a buried-well vertically pinned photodiode, and a floating diffusion region separated from a transfer gate configured for vertical pump-gate charge transfer from the buried well to the floating diffusion. The model size can be further shrunk for QIS and DIS use, and can also be increased for normal (conventional) image sensor use.

The simulation demonstrated the operational feasibility of the device. Illustrative results of the simulation are shown in the figures as follows.

Figure 6B:
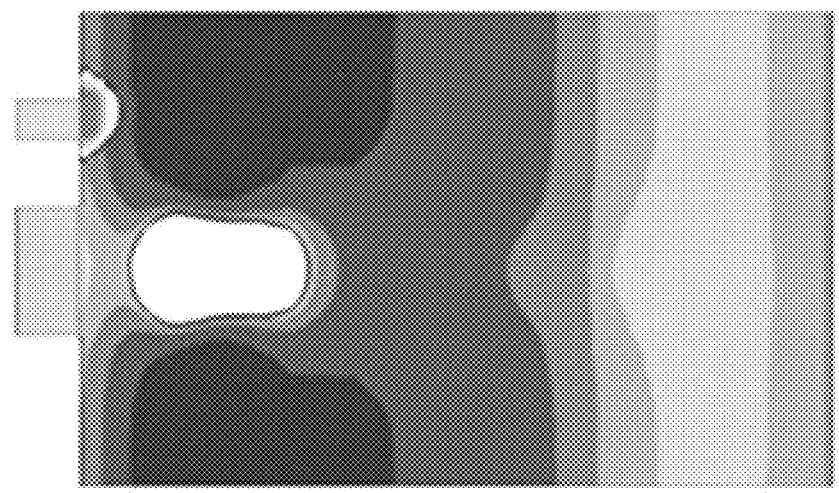
FIG. 6B is a simulated doping profile of a cross-section of FIG. 6A, in accordance with a TCAD simulation according to some illustrative embodiments.
Figure 6A:
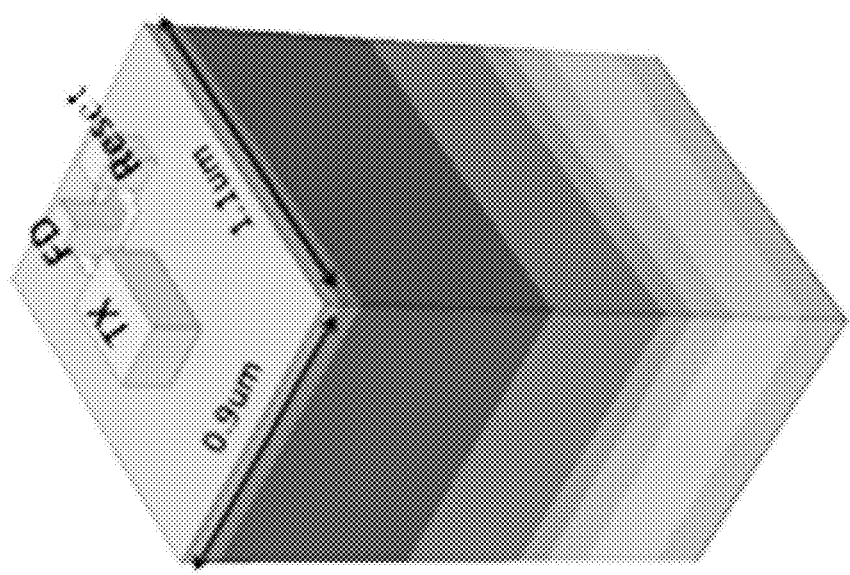
FIG. 6A is a 3D simulated doping profile.

FIG. 6A is a 3D simulated doping profile, and FIG. 6B is a simulated doping profile of a cross-section of FIG. 6A.

The fabrication process was adjusted to realize the expected doping profile. The PD n-type potential well and the surrounding p-type pinning well are realized by multiple-step implantation with relatively high energy. By making use of the channeling effect, the dopant with zero degree tilt angle would suffer minimum energy loss and impinge to deeper positions. Hence, a deeply buried and uniformly distributed n-type doping well could be realized. To achieve the step-shape doping profile of PB and PW region, a fine engineered p-type implantation is settled on the top of the PD well.

Figure 7:
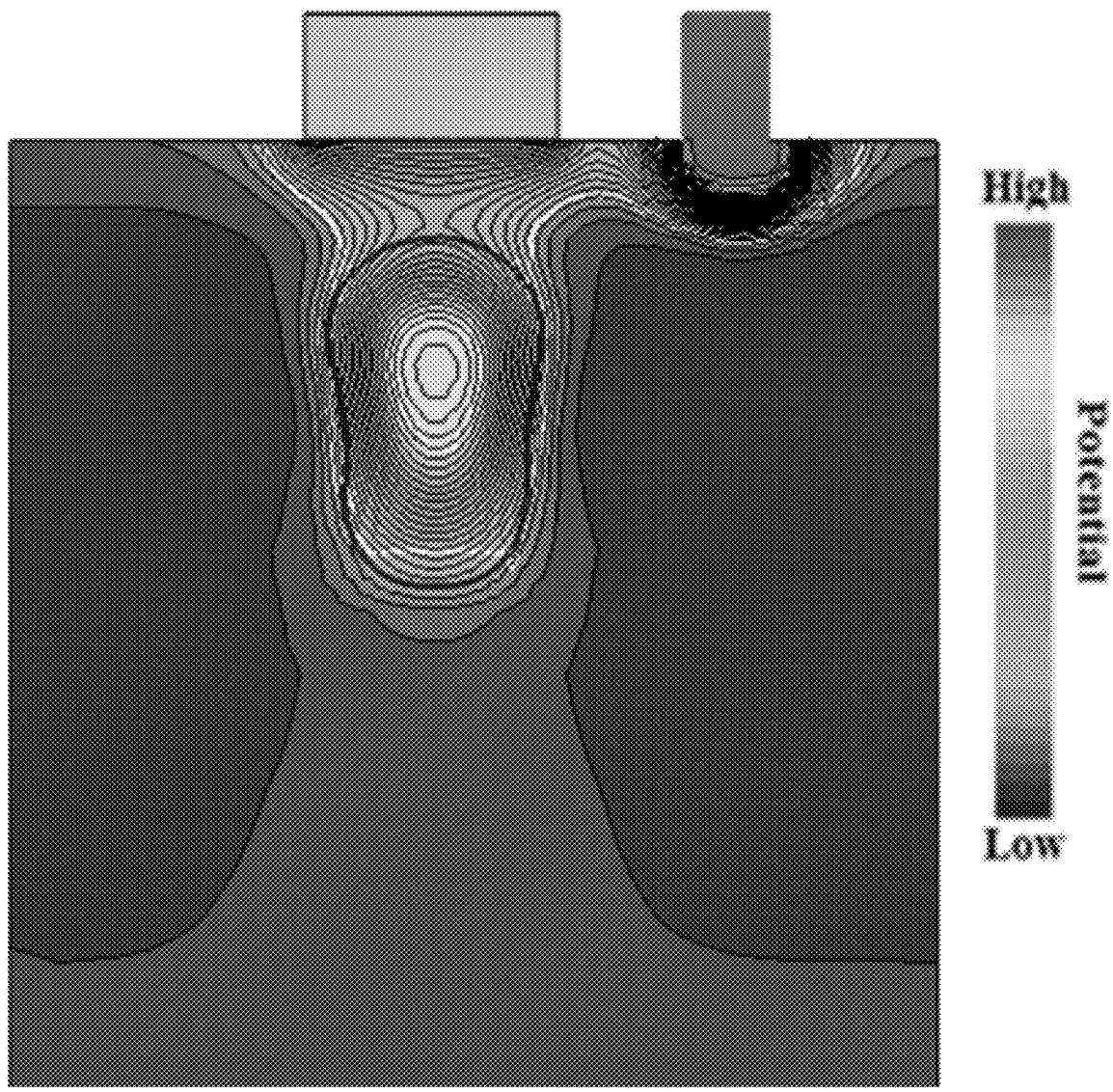
FIG. 7 shows the simulated potential profile when TX is zero biased, in accordance with an illustrative example according to some embodiments.
Figure 8:
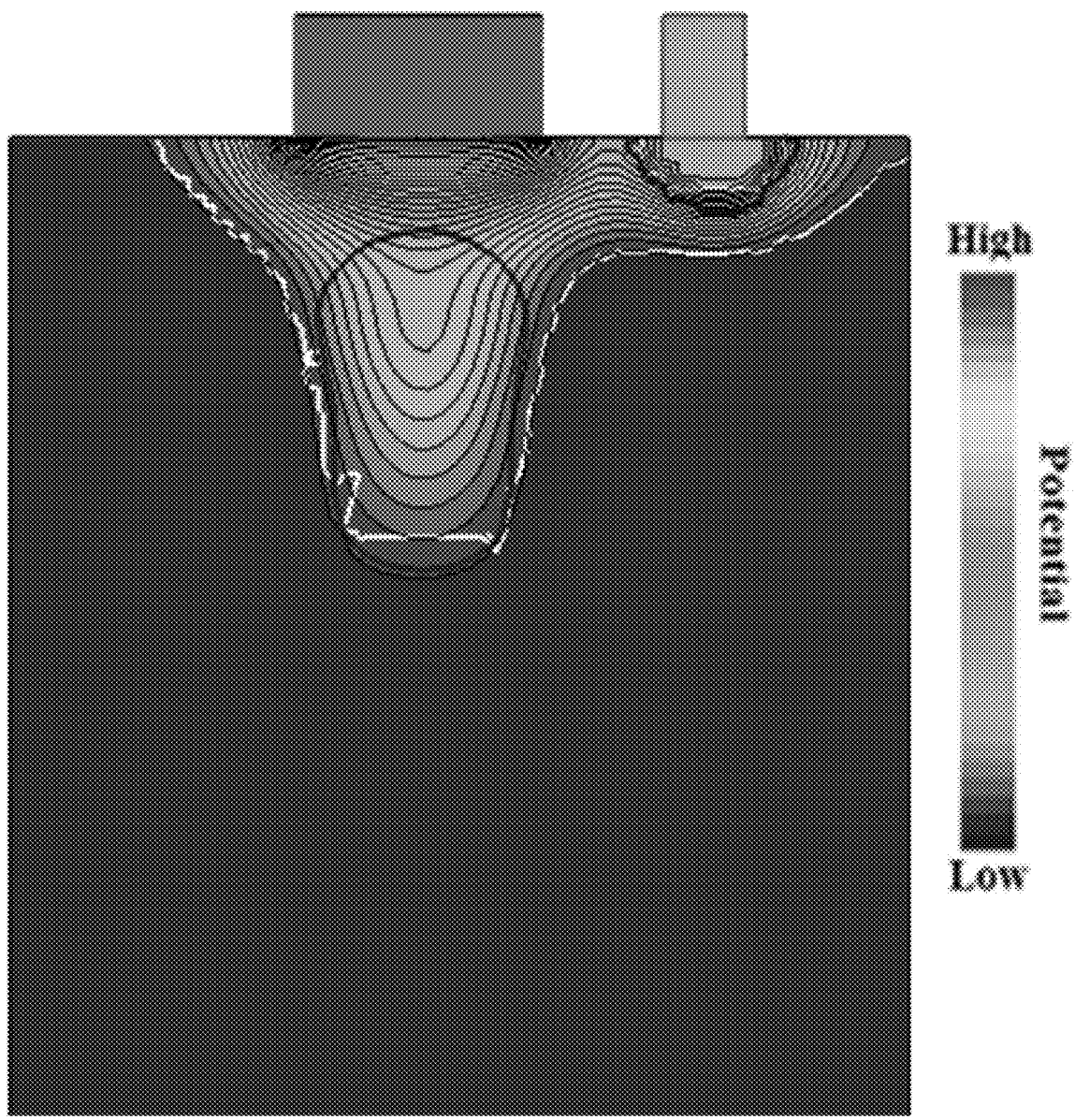
FIG. 8 shows the simulated potential profile when TX is ON (forward biased), in accordance with an illustrative example according to some embodiments.
Figure 9:
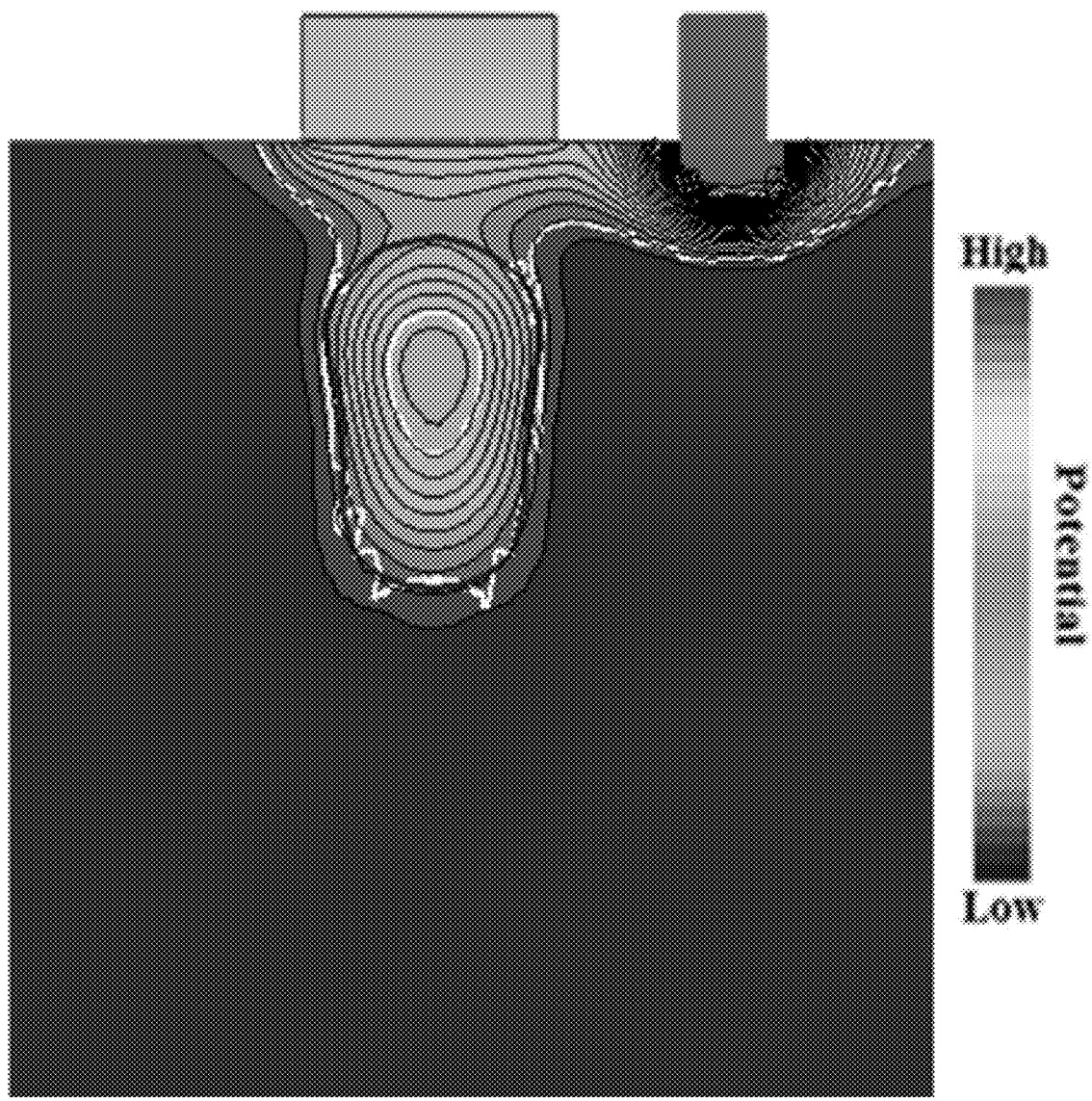
FIG. 9 shows the simulated potential profile when TX is OFF (reverse biased), in accordance with an illustrative example according to some embodiments.
Figure 10:
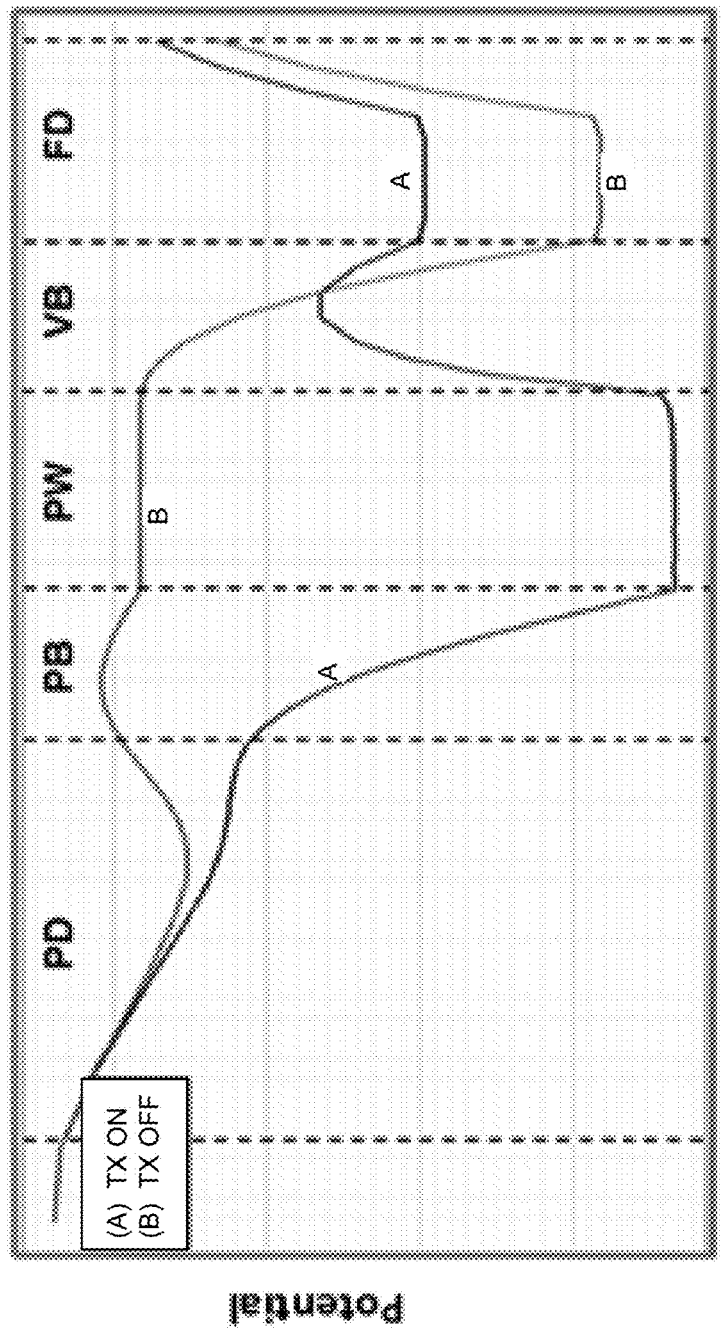
FIG. 10 depicts the simulated potential curves through the regions for TX ON and TX OFF conditions, in accordance with an illustrative example according to some embodiments.

FIG. 7 shows the simulated potential profile when TX is zero biased;

FIG. 8 shows the simulated potential profile when TX is ON (forward biased);

FIG. 9 shows the simulated potential profile when TX is OFF (reverse biased); and FIG. 10 depicts the simulated potential curves through the regions for TX ON and TX OFF conditions.

The process flow was modified to optimize the potential profile. The p-type doping must be well controlled to achieve a desirable threshold voltage. On the other hand, the potential differential between PB and PW needs to be high enough to prevent charge from being injected to PD. The simulation results proved the device can work as expected. As depicted in FIG. 10, when the TX is ON, from PD to PW, potential increases monotonically, meanwhile the VB region forms a potential barrier to separate PW and FD. When the TX is OFF, the potential of PW is higher than that of PB and lower than that of VB.

Figure 11:
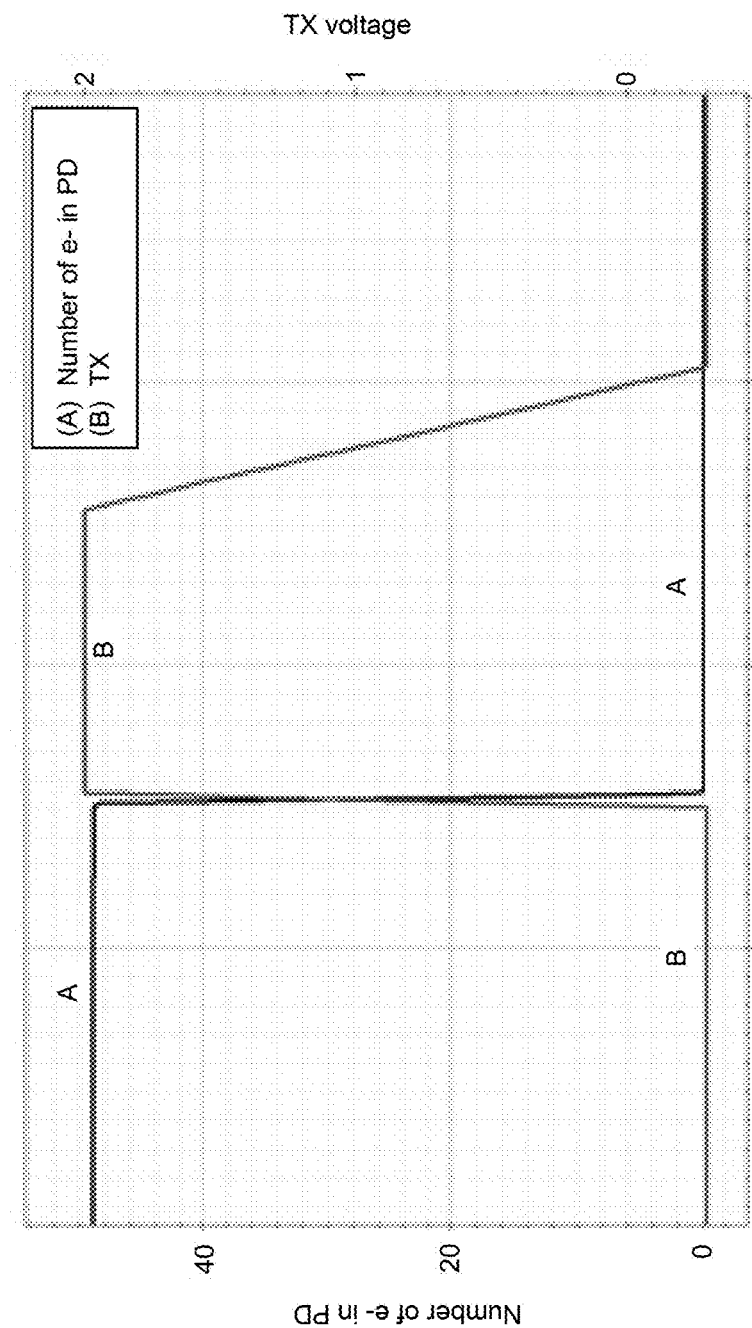
FIG. 11 shows the simulated number of electrons in the PD and corresponding TX voltage during a transfer, in accordance with an illustrative example according to some embodiments.

FIG. 11 shows the simulated number of electrons in the PD and corresponding TX voltage during a transfer.

A fully transfer of electron from PD to FD was observed in the simulation as shown in FIG. 5. One concern of this device is the charge recombination due to the "traps" on the interface. Unlike conventional pinned photodiode, in which the charge will flow to FD directly during transfer, in this pump gate device, the charge stay underneath the transfer gate when TX is ON. The SiO2-Si interface would provide "traps", capturing charge, and cause extra noise. To minimize this effect, the transfer time should be kept as short as possible. Since the full well capacity is several hundred electrons, the transfer time could be limited to several nanoseconds.

With the pump gate, theoretically the conversion gain of this device should be increased for at least 1.5 times with the most advanced process. In the simulation, a 1.8× increase of conversion gain is observed in comparison with a pixel of the same size with conventional pinned photodiode.

The present invention has been illustrated and described with respect to some specific embodiments thereof, which embodiments are merely illustrative of some of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An image sensor comprising a plurality of pixels, each pixel comprising:
   a transfer gate formed on a first surface of a semiconductor substrate;
   a floating diffusion region formed in the semiconductor substrate;
   a pinned photodiode having a charge accumulation/storage region disposed substantially beneath the transfer gate and a pinning region disposed laterally to the charge accumulation/storage region and spaced away from the first surface, wherein an edge of the transfer gate is disposed adjacent to and spaced away from the floating diffusion region by an intervening semiconductor region configured to provide a potential barrier to charge flow from beneath the transfer gate to the floating diffusion, and
   wherein the transfer gate is operable to selectively transfer charge from the charge accumulation/storage region to the floating diffusion region by pumping charge from the buried charge accumulation/storage region underlying the transfer gate, over the potential barrier that is between the transfer gate and the floating diffusion region, and to the floating diffusion region.

2. The image sensor according to claim 1, wherein a first semiconductor region is disposed beneath the transfer gate and overlies the charge accumulation storage region, and a second semiconductor region is disposed beneath the transfer gate and overlies the first semiconductor region and is laterally adjacent to the intervening semiconductor region, and wherein the first semiconductor region is configured to provide a potential barrier that prevents charge from flowing back toward the charge accumulation/storage region during charge transfer from the second semiconductor region to the floating diffusion via the intervening semiconductor region.

3. The image sensor according to claim 2, wherein the first and second semiconductor regions, and the intervening semiconductor region all have the same doping type, with the first semiconductor region having a higher dopant concentration than the second semiconductor region, and the second semiconductor region having a higher dopant concentration than the intervening semiconductor region.

4. The image sensor according to claim 1, wherein the transfer gate is operable to selectively transfer at least a portion of charge accumulated in the charge accumulation/storage region to the floating diffusion region in response to an individual pulse being applied to the transfer gate, by pumping charge (i) from the charge accumulation/storage region to a first potential well in response to the individual pulse pulsing the transfer gate from an OFF state to a given ON state, and (ii) to the floating diffusion from the first potential well over the potential barrier that is between the transfer gate and the floating diffusion region in response to the individual pulse pulsing the transfer gate from said given ON state to an OFF state.

5. An image sensor pixel architecture, comprising:
   a floating diffusion formed in a first surface of a semiconductor substrate;
   a pinned photodiode comprising a pinning region of a first conductivity type and a photocharge accumulation/storage region of a second conductivity type opposite to the first conductivity type, wherein the pinning region (i) extends along a vertical direction substantially perpendicular to the first surface, and (ii) in a region of the semiconductor substrate spaced away from the first surface, is disposed laterally to the charge accumulation/storage region, and (iii) is configured to form a pinned photodiode with the charge accumulation/storage region such that the photocharge accumulation/storage region is fully depleted when empty of photocharge; and
   a transfer gate that is configured to control charge transfer from the photocharge accumulation/storage region of the pinned photodiode to the floating diffusion; and
   wherein the floating diffusion is separated from an adjacent edge of a gate dielectric of the transfer gate such that the floating diffusion is not overlapped by the adjacent edge of the gate dielectric of the transfer gate.

6. The image sensor pixel architecture according to claim 5, wherein the pinning region is configured to sandwich the photocharge accumulation/storage region along at least one lateral direction, wherein p-n junction interfaces formed between the photocharge accumulation/storage region and the pinning region extend along the vertical direction.

7. The image sensor pixel architecture according to claim 6, wherein the pinning region laterally surrounds the photocharge accumulation/storage region.

8. The image sensor according to claim 5, wherein the transfer gate is operable to selectively transfer at least a portion of charge accumulated in the charge accumulation/storage region to the floating diffusion region in response to an individual pulse being applied to the transfer gate, by pumping charge (i) from the charge accumulation/storage region to a first potential well in response to the individual pulse pulsing the transfer gate from an OFF state to a given ON state, and (ii) to the floating diffusion from the first potential well over a potential barrier that is between the transfer gate and the floating diffusion region in response to the individual pulse pulsing the transfer gate from said given ON state to an OFF state.

9. A CMOS active pixel image sensor comprising an array of pixels, each pixel configured for selective intra-pixel charge transfer from a respective storage node that is primarily located under a transfer gate of the pixel, wherein the transfer gate is operable to transfer charge from the storage node to a floating diffusion according to a pump gate architecture that is configured to selectively transfer at least a portion of charge accumulated in the storage node to the floating diffusion in response to an individual pulse being applied to the transfer gate, by pumping charge (i) from the storage node to a first potential well in response to the individual pulse pulsing the transfer gate from an OFF state to a given ON state, and (ii) to the floating diffusion from the first potential well over a first potential barrier that is between the transfer gate and the floating diffusion in response to the individual pulse pulsing the transfer gate from said given ON state to an OFF state.

10. The CMOS active pixel image sensor according to claim 9, wherein the floating gate and the transfer gate do not overlap such that overlap capacitance therebetween is negligible relative to the capacitance of the floating gate.

11. The image sensor pixel architecture according to claim 9, wherein the pump gate architecture includes a second potential barrier disposed between the storage node and the first potential well, and configured to prevent charge from flowing back toward the storage node during charge transfer from the first potential well to the floating diffusion in response to the transfer gate being pulsed from said given ON state to the OFF state.

12. The image sensor pixel architecture according to claim 11, wherein said first potential barrier, said second potential barrier, and said first potential well comprise respective semiconductor regions doped at respective concentrations of a first conductivity type, and wherein said floating diffusion and said storage node comprise respective semiconductor regions doped at respective concentrations of a conductivity type opposite to said first conductivity type.

13. The image sensor pixel architecture according to claim 9, wherein the storage node comprises a doped semiconductor region that forms a p-n junction with a pinning layer of a pinned photodiode.

14. The image sensor pixel architecture according to claim 9, wherein the first potential barrier comprises a gateless semiconductor region disposed between the floating diffusion and the transfer gate.

\* \* \* \* \*